US008685759B2

(12) United States Patent
Wang et al.

(10) Patent No.: US 8,685,759 B2
(45) Date of Patent: Apr. 1, 2014

(54) E-CHUCK WITH AUTOMATED CLAMPED FORCE ADJUSTMENT AND CALIBRATION

(75) Inventors: Jo Fei Wang, Hsin-Chu (TW); Sunny Wu, Hsinchu County (TW); Jong-I Mou, Hsinpu Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 285 days.

(21) Appl. No.: 12/938,610

(22) Filed: Nov. 3, 2010

(65) Prior Publication Data

US 2011/0042006 A1 Feb. 24, 2011

Related U.S. Application Data

(62) Division of application No. 12/412,138, filed on Mar. 26, 2009, now Pat. No. 7,851,233.

(51) Int. Cl.
*H01L 21/66* (2006.01)

(52) U.S. Cl.
USPC .................. 438/14; 118/663; 156/345.24

(58) Field of Classification Search
USPC .................. 438/14–16; 156/345.24, 325.24; 118/663
See application file for complete search history.

(56) References Cited

U.S. PATENT DOCUMENTS

| 5,350,479 A | 9/1994 | Collins et al. |
| 5,812,361 A | 9/1998 | Jones et al. |
| 2009/0107250 A1 | 4/2009 | Son |
| 2010/0008016 A1 | 1/2010 | Onate et al. |

*Primary Examiner* — Matthew Reames
(74) *Attorney, Agent, or Firm* — Haynes and Boone, LLP

(57) ABSTRACT

The present disclosure describes a semiconductor manufacturing apparatus. The apparatus includes a processing chamber designed to perform a process to a wafer; an electrostatic chuck (E-chuck) configured in the processing chamber and designed to secure the wafer, wherein the E-chuck includes an electrode and a dielectric feature formed on the electrode; a tuning structure designed to hold the E-chuck to the processing chamber by clamping forces, wherein the tuning structure is operable to dynamically adjust the clamping forces; a sensor integrated with the E-chuck and sensitive to the clamping forces; and a process control module for controlling the tuning structure to adjust the clamping forces based on pre-measurement data from the wafer and sensor data from the sensor.

20 Claims, 4 Drawing Sheets

E-CHUCK WITH AUTOMATED CLAMPED FORCE ADJUSTMENT AND CALIBRATION

This patent is a divisional of U.S. Ser. No. 12/412,138, filed Mar. 26, 2009, the contents of which is hereby incorporated by reference.

BACKGROUND

In semiconductor integrated circuit (IC) technology, various processes, such as etching, deposition, implantation and lithography patterning, are applied to a semiconductor wafer to form a designed circuit and interconnection. The wafer is processed in a processing chamber while it is secured by a wafer stage in that processing chamber. In one technology, the wafer stage utilizes an electrostatic chuck (E-chuck) to hold the wafer. The e-chuck post protective maintenance (PM) mounting quality is a key factor to impact within-wafer performance. Poor mounting quality causes non-uniformity cross the wafer circuit field and eventually will further cause non-uniform electrical circuit performance. Furthermore, In the new IC technology using 300 mm or 450 mm wafers, it is hard to ensure the E-chuck mounting quality. In an extreme case, the processing chamber needs to be reopened and the wafer needs to be loaded. Therefore, continued improvements to a semiconductor processing tool with an E-chuck and the associated process/control are desired.

SUMMARY

The present disclosure describes a semiconductor manufacturing apparatus. In one embodiment, the apparatus includes a processing chamber designed to perform a process to a wafer; an electrostatic chuck (E-chuck) configured in the processing chamber and designed to secure the wafer, wherein the E-chuck includes an electrode and a dielectric feature formed on the electrode; a tuning structure designed to hold the E-chuck to the processing chamber by clamping forces, wherein the tuning structure is operable to dynamically adjust the clamping forces; a sensor integrated with the E-chuck and sensitive to the clamping forces; and a process control module for controlling the tuning structure to adjust the clamping forces based on pre-measurement data from the wafer and sensor data from the sensor.

The present disclosure also describes a system. In one embodiment, the system includes a measuring device for measuring a wafer for wafer data after a first semiconductor process and an E-chuck for securing the wafer in a processing chamber. The system also includes a sensor embedded in the E-chuck for collecting sensor data and an adjustable clamp for applying a force to the E-chuck during a second semiconductor process, the clamp force responsive to the wafer data and the sensor data.

The present disclosure also describes a semiconductor processing system. In one embodiment, the semiconductor processing system includes a first processing tool adapted to pattern a wafer and a first metrology tool integrated with the first processing tool, and adapted to measure a dimension of the pattern. The system also includes a second processing tool adapted to etch a material layer on the wafer, the second processing tool including a wafer-holding mechanism with an adjustable holding force and a second metrology tool for measuring the wafer for wafer data after the etch. The system further includes a process control module to control the holding force using an automatic process control model.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
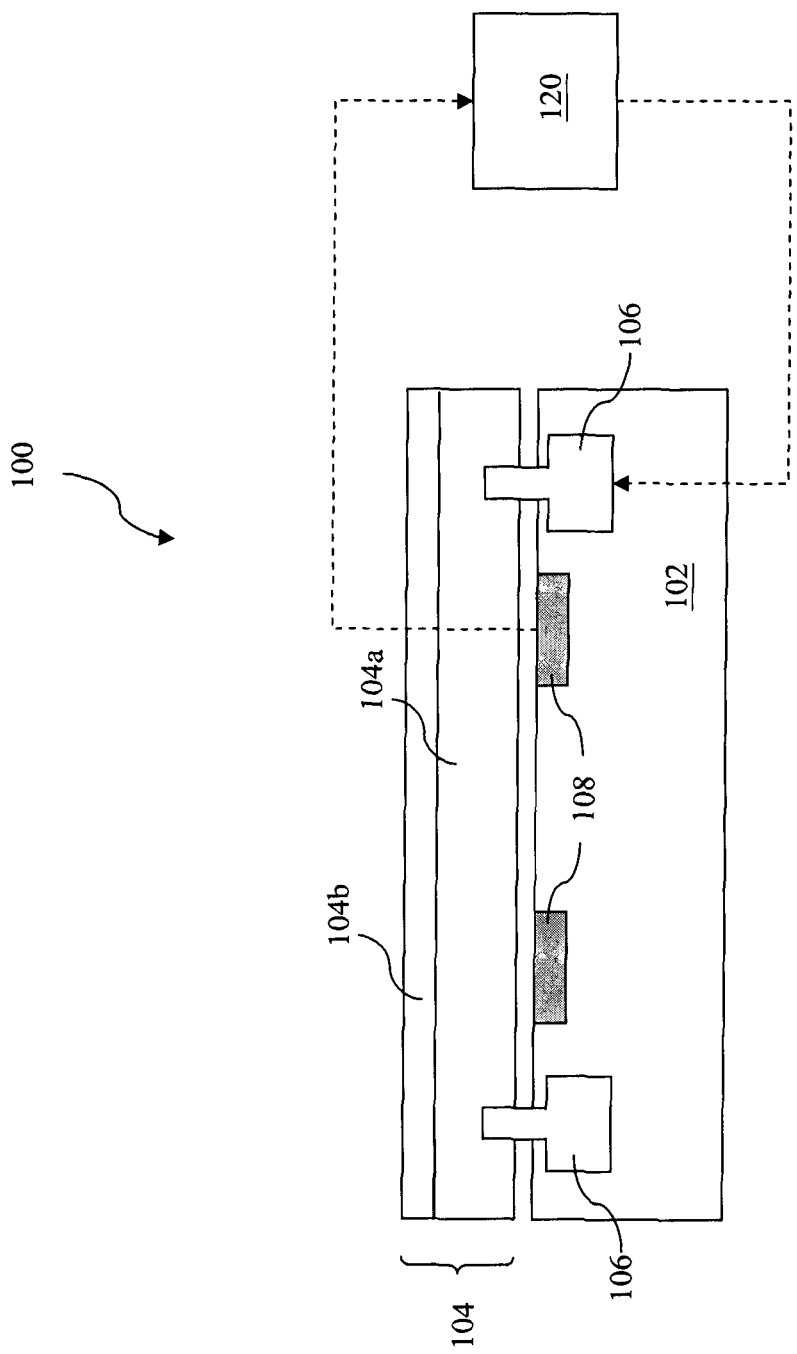
FIG. 1 is a sectional view of one embodiment of an electrostatic chuck (E-chuck) module constructed according to various aspects of the present disclosure.
Figure 2:
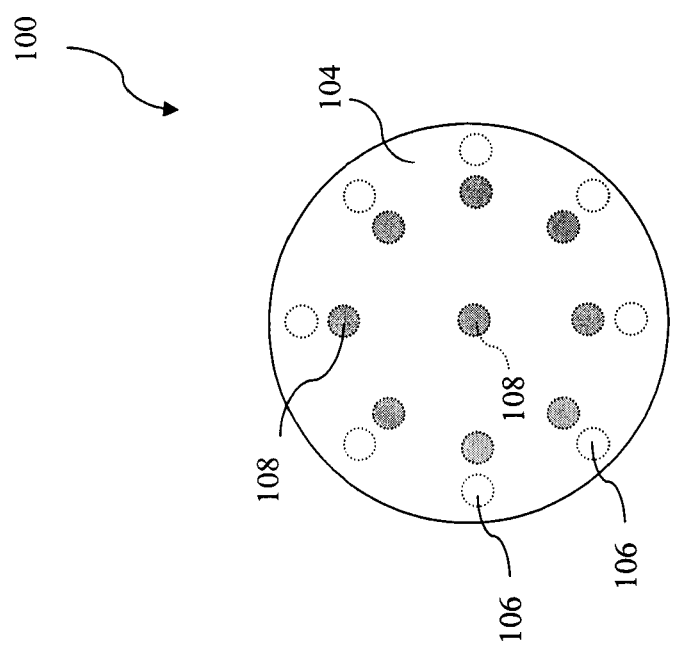
FIG. 2 is a top view of one embodiment of an electrostatic chuck (E-chuck) module constructed according to various aspects of the present disclosure.

Referring to FIG. 1, illustrated is a sectional view of one embodiment of a wafer stage 100 configured to secure a semiconductor wafer during a semiconductor process and designed to be operable to tune a tilting angle of the wafer stage using an advanced process control method. FIG. 2 is a top view of one embodiment of the wafer stage 100. The wafer stage 100 and the method of utilizing the same are described in detail with reference to FIGS. 1 and 2.

The wafer stage 100 is an electrostatic chuck (E-chuck) utilizing an electrostatic force to secure the semiconductor wafer. The E-chuck 100 and a method of implementing the same will be explained below in detail. The E-chuck 100 includes a substrate 102 integrated with a processing chamber that is configured for a semiconductor process, such as etching or deposition process. In various examples, the deposition process may include physical vapor deposition (PVD) or chemical vapor deposition (CVD). The E-chuck 100 also includes a chuck 104 configured on the substrate 102 and designed to hold the wafer thereon. In the present embodiment, the chuck 104 has a round geometric shape, as illustrated in FIG. 2, such that the wafer can be properly sit on the chuck. In one embodiment, the chuck 104 includes an electrode 104a and a dielectric feature 104b formed on the electrode. The electrode 104a is configured such that an electrical voltage can be applied to introduce an electrostatic force to hold the wafer. The dielectric feature 104b is designed to directly contact the wafer such that the electrostatic force can be maintained. In one example, the electrode 104a includes aluminum and the dielectric feature 104b includes aluminum oxide.

The wafer stage 100 also includes a tuning structure (or a holding structure) 106 configured to mechanically hold the chuck 104 to the substrate 102. The tuning structure 106 includes multiple tuning substructures. Each substructure can apply a clamping force to hold the chuck 104 and is designed to be operable to independently adjust the associated clamping force. In another embodiment, each substructure includes a mechanism to automatically tune the associated clamping force. In one example, each substructure includes a fastener and a motor designed to adjust the clamping force. Thus, the tuning structure 106 can dynamically tune the tilting angle of the chuck 104 by selectively and independently adjusting each of the multiple tuning substructures. In one example, the tuning substructures are properly configured, such as an example illustrated in FIG. 2, such that the tilting angle of the chuck 104 can be effectively tuned for improved processing of the wafer.

The wafer stage 100 also includes one or more sensors 108 integrated with the chuck 104. In one embodiment, the sensors 108 includes a stress sensor, a pressure sensor, a force sensor, or combinations thereof. In another embodiment, the sensors 108 are embedded in the substrate 102 to sense the relevant stress, pressure and/or force associated with the clamping forces. In another embodiment, the sensors 108 are properly configured, such as an example illustrated in FIG. 2, to effectively sense the relevant parameters associated with the clamping forces.

The wafer stage 100 is integrated or coupled with a process control module 120 for tuning the clamping forces using an advanced process control (APC) technique. The process control module 120 is coupled to various manufacturing units for manufacturing data communication. In one example, the process control module is connected to a metrology tool for wafer data before a wafer is processed in the processing chamber. In this case, the pre-measurement data can be fed forward to the process control module. In another example, the process control module is connected to another metrology tool for wafer data after a wafer has been processed in the processing chamber. In this case, the post-measurement data can be fed back to the process control module. In another example, the process control module is connected to the sensors 108 for sensor data while the wafer is in the processing chamber. In this case, the clamping forces can be online provided to the process control module. The process control module 120 is also connected to the tuning structure 106 to control thereof. The process control module 120 further includes a control model implemented to control the tuning structure 106. The control model includes a feedback mechanism and/or a feed forward mechanism to provide various manufacturing data including wafer data, processing data, tool data and/or metrology data to control the tuning in various embodiments. In another embodiment, the process control module 120 includes one or more process models to relate the manufacturing data to the clamping forces such that the clamping forces can be properly tuned for expected tilting angle of the chuck. In one embodiment, the process control module includes a first process model to relate between the pre-measurement data and the clamping forces. For example, the pre-process is a lithography patterning. The pre-measurement data may include a critical dimension (CD) of a patterned photoresist layer formed on a wafer. In another embodiment, the process control module includes a second process model to relate between the post-measurement data and the clamping forces. for example, the process is an etching process. The post-measurement data may include after etching CD of a material layer disposed on the wafer. In another example, the process is a sputtering deposition. The post-measurement data include a thickness of the deposited film.

The wafer stage 100 is integrated with the processing chamber and may include other modules for proper functionality. For example, the wafer stage may include a structure to provide wafer backside heating gas. In another example, the wafer stage may alternative be another type of structure capable of securing a wafer. For example, the wafer stage includes a vacuum chuck to hold a wafer. In another example, the wafer stage include a clamp structure to hold a wafer. In another example, the process control module may be distributed within the associated processing tool or distributed in the semiconductor fab, and properly coupled with the wafer stage for the tuning. In one embodiment, the processing chamber is a portion of the processing tool such as an etch tool or a deposition tool. The wafer stage 100 is designed to be able to tilt through tuning the clamping forces according to various manufacturing data, such as the pre-measurement data, post-measurement data and/or the sensor data from the sensors 108, controlled by the process control module 120. By control the tilting of the wafer stage and the wafer thereon, the wafer can be processed in the processing chamber with optimized process condition and/or compensated wafer uniformity. In one example of the wafer stage in the processing chamber for sputtering deposition, in the wafer stage tuned with proper tilting angle, the wafer on the wafer stage can be deposited with a film with improved uniformity since the deposition rate and uniformity are related with the spacing between the sputtering target and the wafer.

Figure 3:
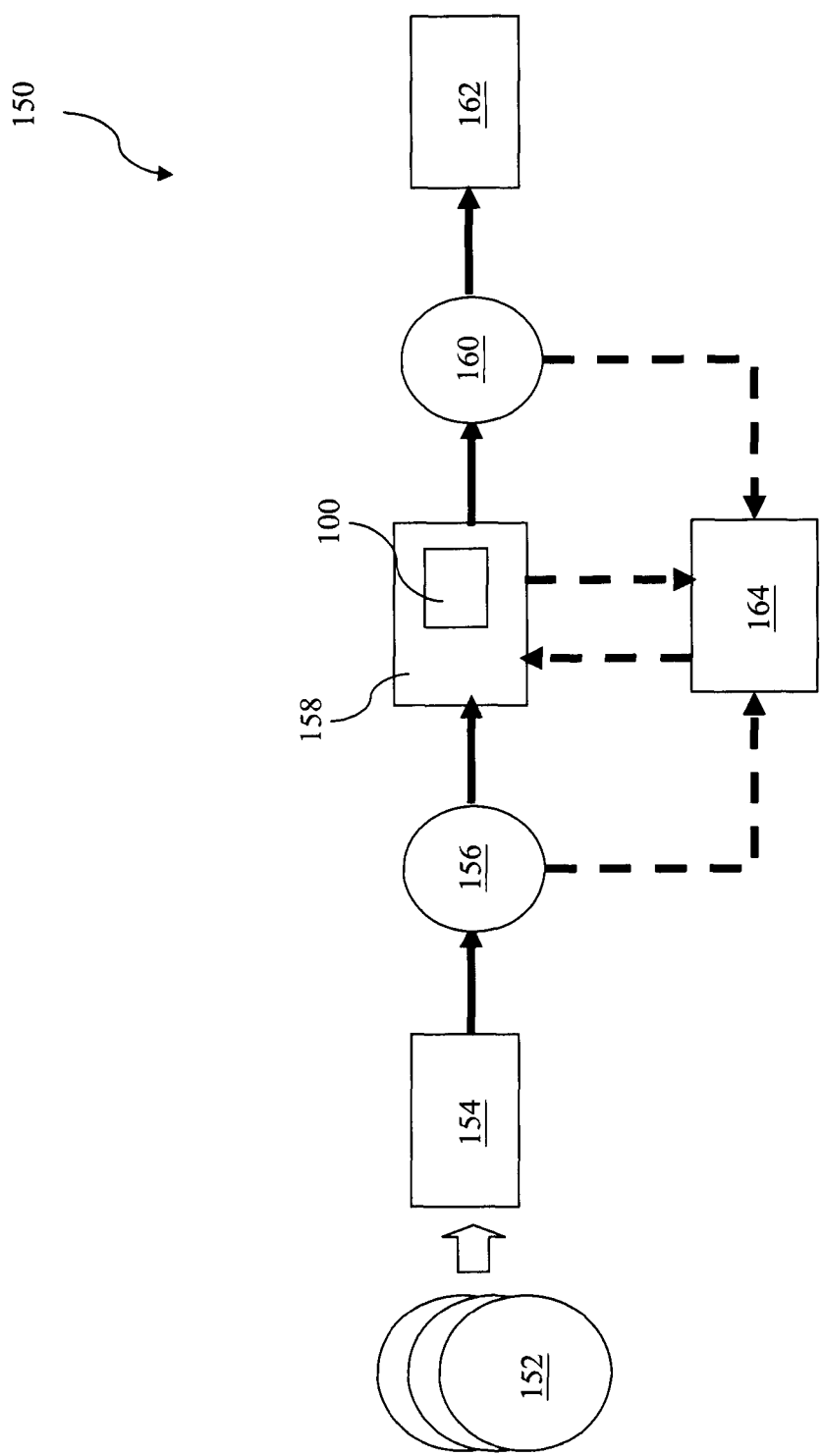
FIG. 3 is a block diagram of one embodiment of a semiconductor processing system utilizing the E-chuck module of FIG. 1 according to various aspects of the present disclosure.

FIG. 3 is a block diagram of one embodiment of a semiconductor processing system 150 utilizing the wafer stage 100 of FIG. 1 constructed according to various aspects of the present disclosure. The semiconductor processing system 150 may be a portion of a semiconductor fab and designed to perform processes to one or more semiconductor wafers 152. The semiconductor wafers (or wafers) 152 include silicon wafers. Alternatively, the semiconductor wafers 152 can be silicon germanium wafers or wafers of other proper semiconductor materials. The semiconductor wafers 152 may include a portion of an integrated circuit and interconnect structure. For example, the semiconductor wafers 152 may include various doped features in silicon and may additionally include others features, such as gate electrodes and/or metal lines. The system 150 includes a first processing tool 154 designed to apply a first process to the wafers. In one example, the first processing tool is a lithography exposure apparatus to expose a photoresist (or resist) layer on the wafers. In furtherance of this example, the first processing tool may additionally include a track unit integrated with the lithography exposure apparatus for other processes, such as photoresist coating, baking, and developing.

The system 150 also includes a first metrology tool 156 designed for measuring the wafers for wafer data after the first process by the first processing tool. In one example, the first metrology tool 156 can measure the CD of the patterned photoresist layer. The metrology tool 156 may be integrated with the first processing tool to be capable to implement online or in situ measurement to the wafers in the processing tool 154.

The system 150 includes a second processing tool 158 designed to implement a second process to the wafers. In one example, the second processing tool is an etch tool to etch a material layer on the wafers. In another example, the second process tool is a deposition tool, such as CVD or PVD, to deposit a film on the wafers. The second processing tool 158 includes a processing chamber (not shown). The second processing tool 158 includes a wafer stage in the processing chamber. The wafer stage is substantially similar to the wafer stage 100 of FIG. 1. A wafer can be processed when it is positioned on the wafer stage 100 in the processing tool 158.

The system 150 also includes a second metrology tool 160 designed for measuring the wafers for wafer data after the second process by the second processing tool 158. In one example, the second metrology tool 160 can measure a critical dimension of an etched material layer. For example, the material on the wafer is etched using the patterned resist layer as an etch mask. The etched material layer is measured by the second metrology tool for a CD, such as the width of the etched line. The metrology tool 160 may be integrated with the second processing tool 158 to be capable to implement online or in situ measurement to the wafers in the second processing tool. The system 150 may additionally includes another processing tool 162 designed to implement a subsequent process to the wafers after the second process by the second processing tool.

The system 150 further includes a process control module 164 designed to control the wafer stage 100 by tuning the clamping forces using an APC method. The process control module 164 is substantially similar to the process control module 120 of FIG. 1 and is distributed in the system 150. In one embodiment, the process control module 164 is integrated with the processing tool 158. The process control module 164 is coupled to the tuning structure 106 to control the tuning of the clamping forces. In one example, the process control module 164 is coupled with the first metrology tool 156 for the pre-measurement data. In another example, the process control module 164 is coupled with the second metrology tool 160 for the post-measurement data. The process control module 164 is further coupled with the wafer stage sensors 108 for sensor data. The process control module 164 further includes a control model designed to control the clamping forces using an APC method. In one example, the process control module 164 includes a first process model to relate the pre-measurement data from the first metrology tool 156. In another example, the process control module 164 includes a second process model to relate the post-measurement data from the second metrology tool 160.

The system 150 integrated with the wafer stage 100 is designed to perform a process to a wafer positioned on the wafer stage 100. The wafer stage 100 can tilt the wafer by adjusting the tuning structure 106 according to various manufacturing data, such as the pre-measurement data from the first metrology tool 156, the post-measurement data from the second metrology tool 160, and/or the sensor data from the sensors 108, that is controlled by the process control module 120. By controlling the tilting of the wafer stage and the wafer thereon, the wafer can be processed in the processing tool 158 with an optimized process condition and/or wafer uniformity.

Figure 4:
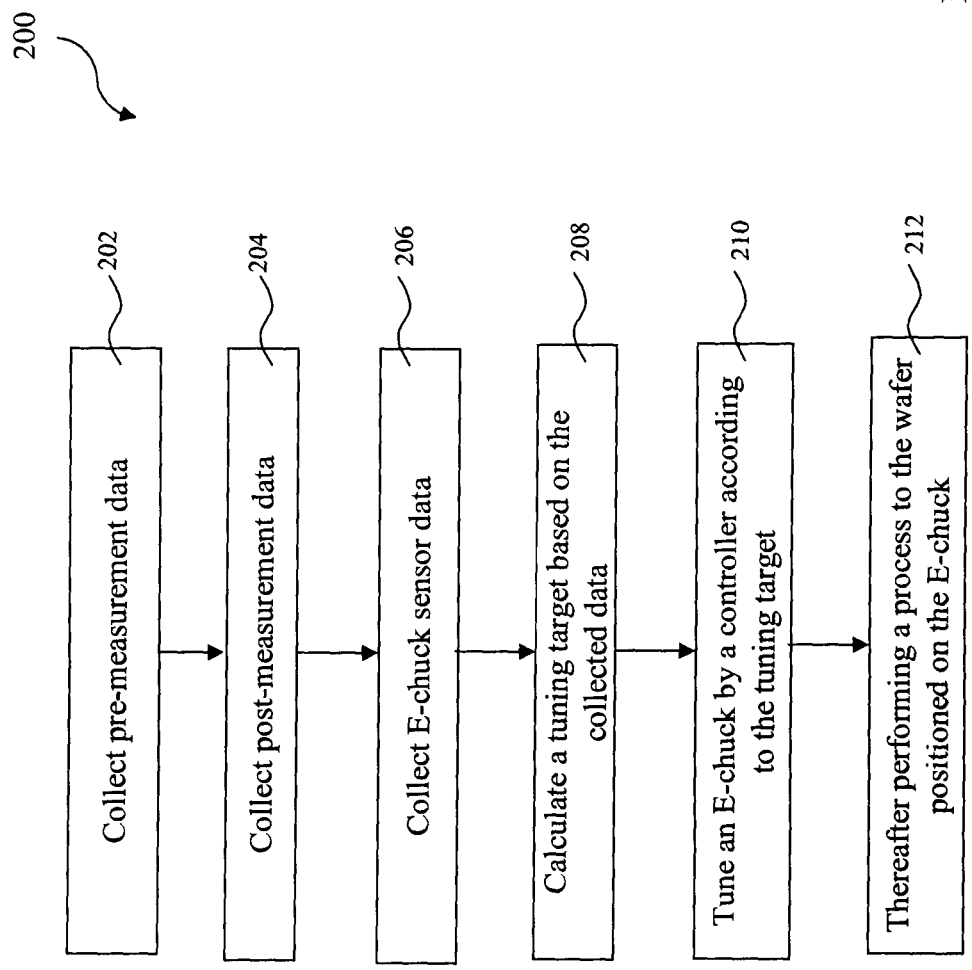
FIG. 4 is a flowchart of a method that can be implemented in the E-chuck module of FIG. 1 and the semiconductor processing system of FIG. 3 according to various aspects of one embodiment of the present disclosure.

FIG. 4 is a flowchart of a method 200 that can be implemented in the wafer stage 100 of FIG. 1 and the semiconductor processing system 150 of FIG. 3 constructed according to various aspects of one embodiment of the present disclosure. With reference to FIGS. 1 through 4, the method 200 is described in detail. The method 200 begins at step 202 by collecting pre-measurement data from the first metrology tool 156 after a wafer has been processed at the first processing tool 154. As an example, the first processing tool 154 is a lithography exposure apparatus and the first metrology tool 156 is a CD metrology tool. The wafer includes a material layer, such as polysilicon layer or a dielectric layer, to be etched. The wafer further includes a patterned photoresist layer formed on the material layer and used as an etch mask. The pre-measurement data includes the CD data of the patterned photoresist layer.

The method 200 proceeds to step 204 by collecting, from the second metrology tool 160, post-measurement data of a plurality of wafers processed in the second processing tool 158. The plurality of wafers have been processed through the first and second processing tools in the similar process flow. In one example, the second processing tool is an etching tool. The second process implemented in the second processing tool is an etching process to etch the material layer using the patterned photoresist layer as an etch mask. The second metrology tool 160 is a CD metrology tool to measure the CD of the etched material layer. The post-measurement data include critical dimensions of the etched material layer.

The method 200 proceeds to step 206 by collecting sensor data from the sensors 108 of the wafer stage 100. The sensor data are collected after the wafer is positioned on the wafer stage and before the second process, such as etching or deposition, is applied to the wafer in the second processing tool 158.

The method 200 proceeds to step 208 by calculating the tuning target based on the collected data, including the pre-measurement data, the post-measurement data, and/or the sensor data. The wafer is secured on the wafer stage by a set of initial clamping forces. The tuning target can be the clamping forces by the tuning structure 106 or the offsets of the clamping forces to the initial clamping forces. The calculating the tuning target involves the control model, the first process model and/or the second process model of the process control module. As an example, the first process model is applied to the pre-measurement data to calculate the clamping forces. In one embodiment, CD bias can be extracted from the pre-measurement data. Then the first process model can relate the CD bias and the clamping forces. The first process model may include various manufacturing data/parameters associated with the second process. For example, the first process model may simulate the second process based on the manufacturing data/parameters such that the clamping forces are related to wafer tilting. The etch process is related to the wafer tilting. Then the CD bias of the etching is related to the etch process. Therefore, by tuning the clamping force, the CD bias from the first process can be properly compensated by the second process with improved CD uniformity and reduced CD deviations. In furtherance of the example, an equation is provided below in a matrix format.

$$\begin{bmatrix} \Delta CD_{site-1} \\ \Delta CD_{site-2} \\ \vdots \\ \Delta CD_{site-i} \end{bmatrix} = \begin{bmatrix} \omega_{11} & \omega_{21} & \cdots & \omega_{j1} \\ \omega_{12} & \omega_{22} & & \vdots \\ \vdots & & & \vdots \\ \omega_{1i} & \cdots & \cdots & \omega_{ij} \end{bmatrix} \begin{bmatrix} Force_{site-1} \\ Force_{site-2} \\ \vdots \\ Force_{site-j} \end{bmatrix}$$

In this equation, $\Delta CD_{site-i}$, represents a CD bias on the site i of the wafer, such as the CD bias of the photoresist layer on site i. $Force_{site-j}$ represents the clamping force on site j by the $j^{th}$ tuning substructure. $\omega_{ij}$ represents a coefficient relating the clamping force at site j to the CD bias at site i. The process control module can use the exemplary model provided in this equation to determine the tuning target, such as the clamping forces at various sites. In another embodiment, the tuning target may be determined based on both the pre-measurement data and the post-measurement data. In another embodiment, the sensor data is fed to the process control module for the differences between the current clamping forces and the tuning target.

The method 200 proceeds to step 210 by in-situ tuning the clamping forces through the tuning structure 106 by the process control module, based the tuning target, such as $Force_{site-j}$. Based on the tuning target, the clamping force at each site is tuned to the target by tuning the tuning structure 106. The tuning is implemented by the process control module in coordination with the sensors and the tuning structure.

Then the method proceeds to step 212 by applying the second process, such as etch, to the wafer secured on the wafer stage 100 in the processing tool 158. Since the wafer stage is properly tilted by tuning the clamping forces. The second process applied to the wafer is optimized for reduced deviation and enhanced within wafer uniformity.

The present disclosure provides various embodiments of a semiconductor processing system, a wafer stage and a method to utilize the processing system and the wafer stage. Other variations may also be possible within the scope of the invention. In one embodiment, various steps of the method 200 may be implemented at different sequences. For example, the steps 202, 204 and 206 may be implemented in different order. In other embodiments, only a subset of the steps 202, 204 and 206 is implemented in a particular case.

Thus, the present disclosure provides a semiconductor manufacturing method. The method includes performing a first process to a wafer; measuring the wafer for wafer data after the first process; securing the wafer on an E-chuck in a processing chamber; collecting sensor data from a sensor embedded in the E-chuck; adjusting clamping forces to the E-chuck based on the wafer data and the sensor data; and thereafter applying a second process to the wafer on the E-chuck in the processing chamber.

In one embodiment, the adjusting further includes adjusting the clamping forces based on post measurement data from wafers processed on the E-chuck of the processing chamber by the second process. The semiconductor manufacturing method may further include implementing a process model to relate the post-measurement data to the clamping forces. The adjusting of the clamping force may include applying a process model to the wafer data to relate the wafer data to the clamping forces. The second process may include a semiconductor process selected from the group consisting of etching, chemical vapor deposition (CVD), and physical vapor deposition (PVD). The first process may include a lithography patterning to form a photoresist pattern. The wafer data may include critical dimensions of the photoresist pattern. The adjusting may include independently adjusting each of the clamping forces to the E-chuck to compensate a within-wafer non-uniformity introduced to the wafer during the performing of the first process to the wafer.

The present disclosure also provides another embodiment of a semiconductor manufacturing method. The method includes positioning a wafer on a wafer stage in a processing chamber; feeding forward pre-measurement data to a process control module; collecting sensor data from a wafer stage sensor integrated with the wafer stage; generating a tuning target based on the pre-measurement data and the sensor data; adjusting clamping forces to the wafer stage by the process control module based on the tuning target; and thereafter applying a process to the wafer on the wafer stage in the processing chamber. The clamping forces are applied to hold the wafer stage to the processing chamber.

In one embodiment, the wafer stage is an electrostatic chuck (E-chuck). The method may further include implementing a first process model to relate between the pre-measurement data and a first offsets to the clamping forces. The generating may include generating the tuning target according to the first offsets. The method may further include feeding back post-measurement data to the process control module; and implementing a second process model to relate between the post-measurement data and a second offsets to the clamping forces. The generating may include generating the tuning target according to the second offsets.

The present disclosure also provides an embodiment of a semiconductor manufacturing apparatus. The apparatus includes a processing chamber designed to perform a process to a wafer; an electrostatic chuck (E-chuck) configured in the processing chamber and designed to secure the wafer, wherein the E-chuck includes an electrode; and a dielectric feature formed on the electrode; a tuning structure designed to hold the E-chuck to the processing chamber by clamping forces and operable to dynamically adjust the clamping forces; an E-chuck sensor integrated with the E-chuck and sensitive to the clamping forces; and a process control module for controlling the tuning structure to adjust the clamping forces based on pre-measurement data from the wafer and sensor data from the E-chuck sensor.

In one embodiment of the apparatus, the E-chuck sensor is one of a pressure sensor and a stress sensor. The process control module may further include a first process model to relate the pre-measurement data and the clamping forces. The process control module may further include a second process model to relate post-measurement data to the clamping forces. In another embodiment, the process control module is operable to control the tuning structure based on the post-measurement. The processing chamber is designed to perform one of etching and deposition.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A semiconductor manufacturing apparatus, comprising:
    a device operable to measure a wafer for wafer data after a first process;
    a processing chamber operable to perform a second process to the wafer;
    an electrostatic chuck (E-chuck) in the processing chamber, wherein the E-chuck includes:
        a base component;
        a chuck disposed over the base component and having an electrode and a dielectric feature formed on the electrode, wherein the electrode is structurally configured to apply an electrostatic force through the dielectric feature to secure the wafer to the chuck and the dielectric feature is structurally configured to directly contact the wafer to maintain the electrostatic force, the chuck being different than the base component;
        a tuning structure extending from the base component to the chuck, the tuning structure structurally configured to mechanically hold the chuck to the base component by clamping forces, wherein the tuning structure is structurally configured to dynamically adjust the clamping forces, the clamping forces being different than the electrostatic forces;
    a sensor integrated with the E-chuck and sensitive to the clamping forces; and
    a process control module in communication with the device and to adjust the clamping forces holding the chuck to the base component based on the wafer data received from the device and sensor data from the sensor.

2. The apparatus of claim 1, wherein the sensor is one of a pressure sensor and a stress sensor.

3. The apparatus of claim 1, wherein the process control module further includes a first process model that determines a first degree of adjustment to apply to the clamping by relating the wafer data and the clamping forces holding the chuck to the base component, wherein the wafer data includes pre measurement data.

4. The apparatus of claim 3, wherein the process control module further includes a second process model that determines a second degree of adjustment to apply to the clamping forces by relating the wafer data to the clamping forces holding the chuck to the base component, wherein the wafer data includes post measurement data.

5. The apparatus of claim 4, wherein the process control module controls the tuning structure based on the post-measurement data.

6. The apparatus of claim 1, wherein the second process is one of etching and deposition.

7. A system comprising:
a measuring device operable to measure a wafer for wafer data after a first semiconductor process;
an E-chuck in a processing chamber, wherein the E-chuck includes:
a base component;
a chuck disposed over the base component and having an electrode and a dielectric feature formed on the electrode, wherein the electrode is structurally configured to apply an electrostatic force through the dielectric feature to secure the wafer to the chuck and the dielectric feature is structurally configured to directly contact the wafer to maintain the electrostatic force, the chuck being different than the base component;
a sensor embedded in the base component and collecting sensor data;
an adjustable clamp extending from the base component to the chuck, the adjustable clamp applying a mechanical clamping force to the chuck during a second semiconductor process, the mechanical clamping force being different than the electrostatic force; and
a process control module in communication with the measuring device and the sensor, the process control module operable to adjust the mechanical clamping force applied to the chuck based on the wafer data received from the measuring device and the sensor data from the sensor.

8. The system of claim 7, wherein the process control module further adjusts the mechanical clamping force applied to the chuck based on post-measurement data obtained from wafers that have been processed on the E-chuck in the processing chamber by the second process.

9. The system of claim 8, wherein the process control module includes a process model that determines an amount to adjust the mechanical clamping force being applied to the chuck by relating the post-measurement data to the force being applied to the chuck.

10. The system of claim 7, wherein the second process includes a semiconductor process selected from the group consisting of etching, chemical vapor deposition (CVD), and physical vapor deposition (PVD).

11. The system of claim 7, wherein the first process includes a lithography patterning to form a photoresist pattern.

12. The system of claim 11, wherein the wafer data includes critical dimensions of the photoresist pattern.

13. The system of claim 7, wherein the adjustable clamp selectively and independently adjusts each of the mechanical clamping forces to the E-chuck to compensate a within-wafer non-uniformity introduced to the wafer during the performing of the first process.

14. A semiconductor processing system comprising:
a first processing tool operable to pattern a wafer;
a first metrology tool integrated with the first processing tool and operable to measure a dimension of the pattern on the wafer;
a second processing tool operable to etch a material layer on the wafer, the second processing tool including a wafer-holding mechanism that includes:
a base component;
a chuck disposed over the base component and having an electrode and a dielectric feature formed on the electrode, wherein the electrode is structurally configured to apply an electrostatic force through the dielectric feature to secure the wafer to the chuck and the dielectric feature is structurally configured to directly contact the wafer to maintain the electrostatic force, the chuck being different than the base component; and
an adjustable holding force clamp extending from the base component to the chuck, the adjustable holding force clamp applying a mechanical clamping force to the chuck, the mechanical clamping force being different than the electrostatic force; and
a second metrology tool operable to measure the wafer for wafer data after the etch; and
a process control module in communication with the first metrology tool, the process control module operable to adjust the mechanical clamping force based on the measured dimension of the pattern received from the first metrology tool.

15. The system of claim 14, wherein the process control module is integrated with the second processing tool.

16. The system of claim 14, wherein the process control module is coupled with one of the first or second metrology tool.

17. The system of claim 14,
wherein the process control module includes a control model designed to control the mechanical clamping force,
wherein the process control module includes a first process model to relate measurement data from the first metrology tool, and
wherein the process control module includes a second process model to relate the measurement data from the second metrology tool.

18. The system of claim 15, wherein the wafer holding mechanism tilts the wafer by independently adjusting structural features of a tuning structure according to the measurement data from the first metrology tool and from the second metrology tool.

19. The apparatus of claim 1, wherein a first portion of the tuning structure extends into the base component and a second portion of the tuning structure extends into the chuck.

20. The system of claim 7, wherein the process control module includes a process model that determines an amount to adjust the mechanical clamping force applied to the chuck based on a simulation of the second semiconductor process conducted by the process model.

* * * * *